United States Patent
Greenberg et al.

(10) Patent No.: US 6,426,547 B1
(45) Date of Patent: Jul. 30, 2002

(54) LATERAL POLYSILICON PIN DIODE AND METHOD FOR SO FABRICATING

(75) Inventors: David R. Greenberg, White Plains; Dale K. Jadus, Wappingers Falls; Seshadri Subbanna, Brewster; Keith M. Walter, Walkill, all of NY (US)

(73) Assignee: Information Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,624

(22) Filed: Dec. 12, 2000

(51) Int. Cl.[7] .............................................. H01L 31/075
(52) U.S. Cl. .............................. 257/656; 257/75; 257/67
(58) Field of Search ............................... 257/67, 75, 656

(56) References Cited

U.S. PATENT DOCUMENTS

| | | |
|---|---|---|
| 3,982,267 A | 9/1976 | Henry |
| 4,751,193 A * | 6/1988 | Myrick .......................... 437/19 |
| 5,268,310 A | 12/1993 | Goodrich et al. |
| 5,610,790 A * | 3/1997 | Staab et al. ..................... 361/56 |
| 5,789,286 A | 8/1998 | Subbanna |
| 5,886,374 A | 3/1999 | Sakamoto et al. |

OTHER PUBLICATIONS

Masatada Horuichi and Masao Tamura, "Lateral SPE Recovery of Implanted Source/Drain in Thin SOI MOSFETS," IEEE PROC 1998 Int. Conf. on Ion Implementation.
Ishiwara, H., et al., "Lateral Solid Phase Epitaxy of Amorphous Si Films on Si Substrates with SiO2 Patterns," *Appl. Phys. Lett.*, vol. 43, No. 11, Dec. 1, 1983, pp. 1028–1030.
Moniwa, M., et al., "Influence of Si Film Thickness on Growth Enhancement in Si Lateral Solid Phase Epitaxy," *Appl. Phys. Lett.*, vol. 52, No. 21, May 23, 1988, pp. 1788–1790.

* cited by examiner

Primary Examiner—Jerome Jackson, Jr.
(74) Attorney, Agent, or Firm—Connolly Bove Lodge & Hutz; Tiffany L. Townsend, Esq.

(57) ABSTRACT

The invention provides a PIN diode having a laterally extended I-region. The invention also provides a method of fabricating the inventive PIN diode compatible with modern RF technologies such as silicon-germanium BiCMOS processes.

18 Claims, 3 Drawing Sheets

LATERAL POLYSILICON PIN DIODE AND METHOD FOR SO FABRICATING

FIELD OF THE INVENTION

The present invention relates to PIN diodes and particularly a diode structure wherein the various conductive regions are laterally disposed.

BACKGROUND

Electronic switches are key for a large variety of applications, in particular, the very high volume consumer wireless 1–2 GHz market where they serve to switch the antenna in a mobile phone between receive and transmit circuits. A good switch must possess several important properties. First, the resistance should be low when the switch is on. Second, the isolation should be good when the switch is off. Finally, the switch should be able to handle a signal of sufficient strength without distorting it (i.e. without the signal itself causing the switch to turn further on or off compared to its initial state).

One type of switch has been very successful at high frequencies is the PIN diode, which consists of an intrinsic or "I" region sandwiched between P and N regions. When this diode is reverse biased (P region at a negative voltage compared with the N region), the switch is off. When the diode is forward biased, the switch turns on. In addition, a great deal of charge gets stored in the "I" region of the device. This charge serves two purposes—it helps reduce the resistance of the switch, and, since the charge must be removed to turn the switch off, it slows down the speed at which the switch can go from on to off. This is important because it means that high-frequency signals passing through the switch won't influence the on/off state of the switch itself (i.e. a large signal excursion won't turn the switch off). Thus, an important factor for good PIN diode performance is the volume of stored charge. The volume of stored charge, in turn, is related to two numbers—the volume of the I region, and the lifetime of carriers in the I region.

It is standard in the art to make individual, discrete PIN diodes comprising large I regions. However, customers increasingly require integrated solutions. For reasons of cost, reliability, and compactness, customers want to be able to put switches directly on the chips that implement their RF transmitters and receivers, to make complete or partial systems-on-a-chip.

The current state of RF technologies, for example silicon-germanium BiCMOS, tends to build all the transistors and other front-end-of-the-line devices in a thin epitaxial layer grown on top of a substrate. The current art limits the dimensions of the I region, and therefore the charge capacity of prior art, vertically-disposed PIN diodes, by the thickness of the epitaxial layer. Typically, the process commences with a substrate into which is implanted a heavily-doped $N^+$ subcollector layer. A thin, typically less than 1 micrometer, epitaxial layer is grown over the $N^+$ layer. The N+ layer diffuses upward leaving at most a 0.5 micrometer layer to comprise the I-region. There simply isn't enough thickness of material to make a large I region in a PIN diode by growing the I-layer in the vertical direction.

A need exists for a PIN diode having a sufficiently large I-region that is capable of being integrated into modern RF processes.

A need exists for such a PIN diode capable of being fabricated using typical processing steps current in the art of making such RF devices. Such a PIN diode would then come substantially for free with current process steps.

Other objects and advantages will become apparent from the following disclosure.

SUMMARY OF INVENTION

The present invention provides an improved and novel lateral PIN diode structure that laterally extends the intrinsic region thereby extending the charge storage area. The present invention provides for reduced parasitic capacitance by placing the diode on an oxide layer.

The present invention provides a lateral PIN diode comprising large-grained polysilicon and having an extended intrinsic region formed over thick oxide isolation.

Referring to FIG. 2, the present invention provides an extended charge storage, lateral PIN diode comprising a first semiconductor layer (1) of a first conductivity type; field isolation means (2) formed on a major surface of said first semiconductor layer; a second semiconductor layer (4) formed above and on a major surface of said field isolation means, wherein said second semiconductor layer comprises N-type, intrinsic, and P-type regions, and wherein said intrinsic region lies between and abuts said N-type and said P-type regions; an oxide film (7) formed on a major surface of said second semiconductor layer; and a masking module which module may optionally be an emitter module, formed on a major surface of said oxide film wherein said masking module is aligned above said intrinsic region and wherein said masking module masks the edges of the N-type and P-type regions.

The present invention provides a extended charge storage, lateral PIN diode optionally comprising: an opening formed through said field isolation means communicating with said first semiconductor layer; wherein a portion of said second semiconductor layer fills said optional opening and abuts said first semiconductor layer.

The present invention provides that the PIN device comprises, in a first embodiment, large-grain silicon, and in a preferred embodiment, comprises single crystal silicon.

The present invention provides a means of making a PIN diode with an enlarged I-region such that can be integrated into a modem RF process. The present invention provides that the current flows laterally instead of vertically and scales the I-region by enlarging the lateral dimension between the P and N regions.

The present invention uses process steps common to typical RF device fabrication so that much of the PIN diode comes for free with the existing process. The present invention uses several such steps for free. First, the body of the PIN diode is formed from the layer emplaced for the base of the bipolar transistor and/or the gates of the FETs. Second, the invention provides that the emitter module is used to mask off the I-region during subsequent implantation of the P and N contacts of the diode.

The present invention employs polysilicon as the initial material from which the body of PIN is made. Polysilicon doesn't have a great carrier lifetime because carriers can recombine at grain boundaries. This serves to decrease the stored charge, counteracting our attempt to make a large I-layer.

The first embodiment of the invention provides a PIN that can be integrated into an RF chip and which comes for free with the conventional processing steps. This embodiment provides an implant to amorphize the polysilicon and then an anneal step to regrow it as large grain polysilicon to reduce the grain boundaries and improve the carrier lifetime.

In a second embodiment of the invention, the polysilicon comprising the PIN diode layer is caused to pass through an opening in the underlying dielectric layer and to contact the single crystal substrate. The polycrystalline silicon is amorphized and annealed. The surface of the single crystal silicon acts as a seed causing the PIN diode layer to recrystallize as single crystal silicon in a process known as solid phase epitaxy. Thus the I-layer of the PIN diode will be caused to have high carrier lifetimes.

The invention further provides reduced parasitic capacitances by virtue of building the PIN diode in its own layer atop a layer of isolation oxide (or other dielectric) instead of building the PIN diode into the bulk silicon.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF A PREFERRED EMBODIMENT

Reference is made to the figures to illustrate selected embodiments and preferred modes of carrying out the invention. In the various figures, similar numerals refer to similar features. It is to be understood that the invention is not hereby limited to those aspects depicted in the figures.

First Embodiment

Figure 1:
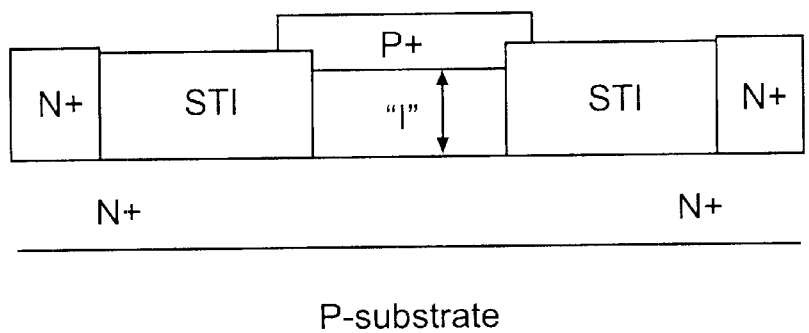
FIG. 1 illustrates a conventional PIN diode.
Figure 2:
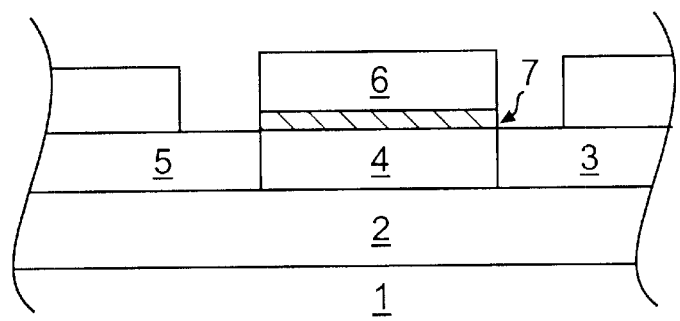
FIG. 2 illustrates a lateral PIN diode in a first embodiment.

Referring now to FIG. 2. The first version comes for free in an epitaxial-base bipolar process such as silicon-germanium BICMOS technology. The semiconductor substrate 1 is standard as is the about 2800 Å oxide layer 2 provided on a top surface. The base polysilicon is used to form the body of the PIN diode and is appropriately masked and doped to yield N+3, intrinsic (I) 4, and P+5 regions. Emitter-base passivation 7 is used to form the passivating layer for the polysilicon, to help reduce the surface recombination by using a high-quality thermal oxide interface. The emitter polysilicon 6 forms a masking layer that prevents future implants from getting into the body of the diode. On this polysilicon layer, the edges of the masks for P+ and N+ implants on either side of the PIN diode body are defined. Prior art PIN diodes are restricted to I-regions of about 0.5 Å by the thickness of the epitaxial layer in which it is formed. By arranging the I-region laterally, the present invention achieves an I-region of about 5–10 micrometers in extent. In preferred embodiments, the emitter module polysilicon and emitter-base passivation mask the implantation and thus define the I-region. Such an embodiment comes for free in a BiCMOS process. However, other structures including a temporary photomask might be substituted where it is desired not to have an emitter module. Thus, for purposes of this disclosure, the terms "emitter module" and masking module are used interchangeably to describe the structure that masks and defines the edges of the I-region for purposes of implantation.

It is known that the grain-boundaries in the poly will give rise to a much higher recombination than in single-crystal silicon. However, in the case of a PIN diode, as long as the leakage is still acceptable, the reduction in device parasitics will result in better performance. Special techniques such as hydrogen annealing can be done to reduce the recombination centers, or, alternatively, grain size growth by long anneals at 600–650° C. The grain size can be enlarged by, for example, amorphizing the layer and then annealing at intermediate temperatures.

Second Embodiment

In an alternative embodiment, an extra mask can be used to open a region of the base polysilicon over the single crystal base, through the emitter-base passivation. The amorphous silicon layer used for the passivation can then be deposited and annealed. This results in epitaxial lateral growth of the amorphous silicon from the seed area in the single crystal base. This results in a single crystal structure which has reduced recombination current. In a fashion similar to the first embodiment, a passivation and masking layer can be formed on top, and the P+ and N+ implants can be defined into opposite ends of the diode body.

Figure 3:
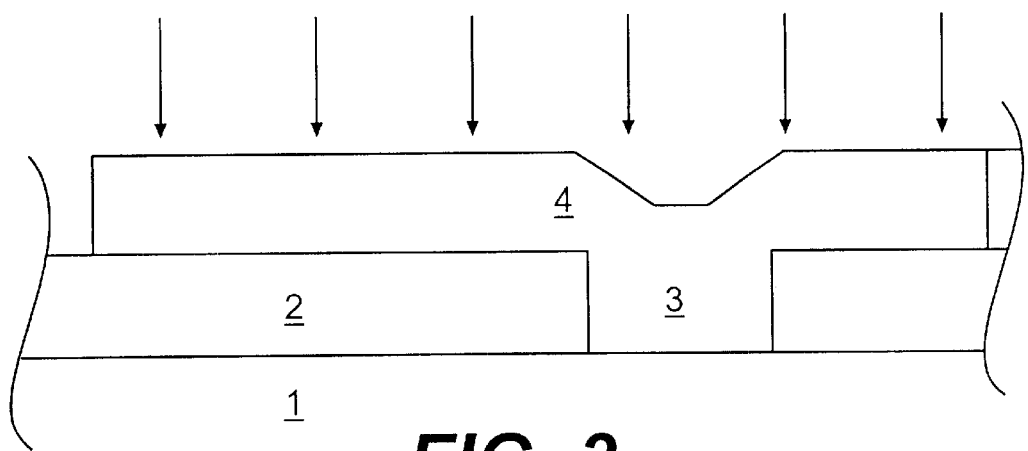
FIGS. 3–6 illustrate steps in the fabrication of the second embodiment of the inventive PIN structure.

Turning now to FIG. 3, a sequence of steps for fabrication of a second embodiment is recited. This recitation refers to a preferred embodiment wherein the substrate is silicon. Therefore, silicon-specific means, such as silicon-specific isolations and process steps are recited. However, it is to be understood that the present invention is capable of being realized in substrates other than silicon and using means appropriate to those other substrates including appropriate isolations and processing steps. The recitation is therefore to be understood as illustrative and not restrictive.

A layer of monocrystalline semiconductor material 1 is provided. This monocrystalline layer may comprise bulk substrate or may comprise an epitaxial layer. The material of this layer may comprise silicon or gallium arsenide. A layer of field isolation 2 is applied over semiconductor layer 1. Field isolation preferentially comprises thick oxide, typically silicon dioxide of from about 1000 to about 5000 Å thick and preferentially 2800 Å thick. Other dielectric films compatible with silicon processing may be used such as silicon nitride. An aspect of the invention is that this dielectric could represent isolation oxide such as shallow trench or LOCOS. In the presently described embodiment, we exercise the option to form an opening 3 in the dielectric. Masking is performed such that the opening, when created, will be immediately to one side of the subsequently formed PIN diode body. Typically, the opening will be displaced from about 1 to about 10 micrometers from the edge of the PIN diode body. Opening 3 is etched through dielectric 2 all the way down to silicon 1. To form the body of the lateral PIN diode a film of polysilicon 4 is deposited and patterned.

Where opening 3 is present, this film must be patterned such that it enters the opening 3 and contacts the underlying silicon 1. In the most efficient implementation of this process, film 4 will be shared with an existing BiCMOS processing step (FET gate polysilicon layer, bipolar base layer, or in a double-poly base process the bipolar extrinsic base contact layer). Thus this film comes for "free" in the process.

Optionally, the crystal grain structure of polysilicon film 4 is enlarged. A non-doping species, e.g. silicon or germanium, is implanted into film 4 to destroy crystal grains and amorphize. An anneal step recrystallizes the film into large-grain polysilicon. When optional opening 3 is present, the silicon surface 1 will induce film 4 to undergo solid-state epitaxy into single crystal silicon, starting from the opening 3 and proceeding laterally towards the end of the patterned edges. Control of grain size permits increased charge carrier lifetimes.

Figure 4:
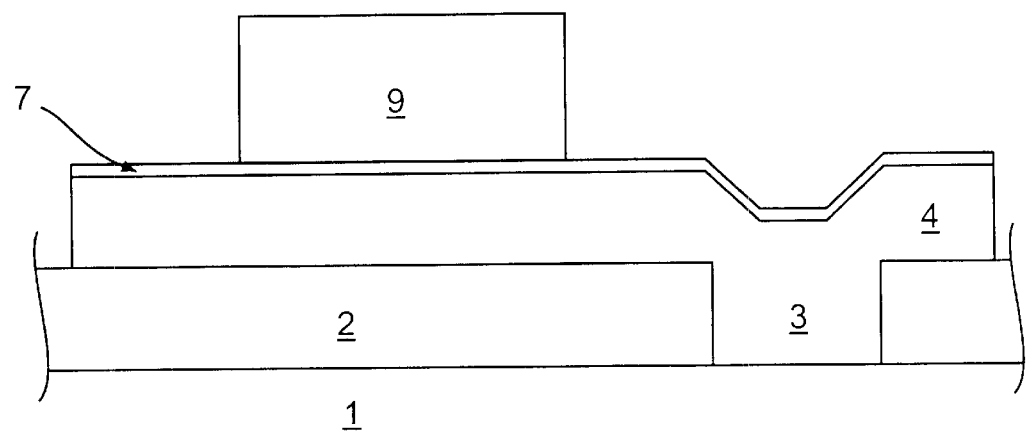

Now with reference to FIG. 4 formation of the emitter module is described. These steps may be combined with the steps used to form the polysilicon emitter of the bipolar transistor in a BiCMOS process, allowing for processing efficiency. Thus these steps come for "free" in this process. A $SiO_2$ layer 7 is formed on the polysilicon film. Preferentially, this layer is >300 Å, and more preferentially it should be about 500 Å thick. Layer 7 should be native or thermal oxide, not deposited. Polysilicon film 9 is deposited, the film is typically about 1000–5000 Å thick. Film 9 is patterned yielding a width equal to the desired lateral dimension of the PIN diode body, typically 1–10 micrometers. The upper limit on the lateral dimension of the I-region is governed by the effective distance of the solid phase epitaxy process. Film 9 may be replaced by deposition and patterning of a material other than polysilicon, such as another dielectric or a temporary photoresist film. Such alternative step would not come "for free" in a typical BiCMOS process.

Figure 5:
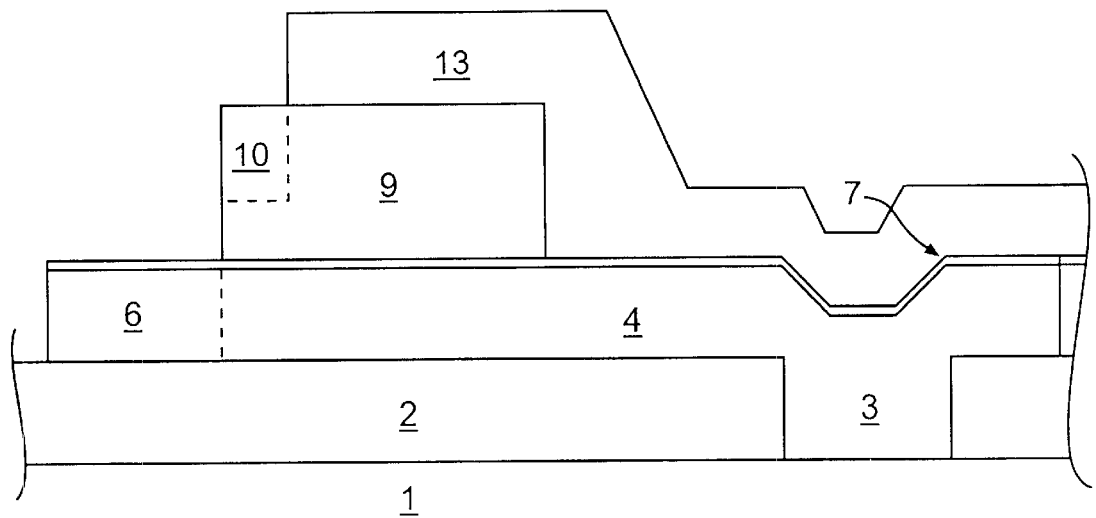

Now, with reference to FIG. 5, formation of the N-region 6 of the PIN and the N-implant 10 is described. A temporary mask, e.g. photoresist 13 is applied and a heavy n-type dopant (e.g. phosphorous or arsenic) is implanted to one side of the diode body. The particular side chosen is a matter of design choice. The final dopant concentration in film 4 should be in excess of $1\times10^{18}$ atoms/centimeter$^3$. For processing efficiency, the implant step may be shared with, for example, a CMOS NFET source/drain implant step, so that it comes "for free" in a BiCMOS process. The top polysilicon 9, which comes "for free" in a bipolar or BiCMOS process, serves to mask implant 10 from getting into the lower silicon film 4, the body region of the PIN diode, thus self-aligning the implant to one edge of the PIN diode body.

Figure 6:
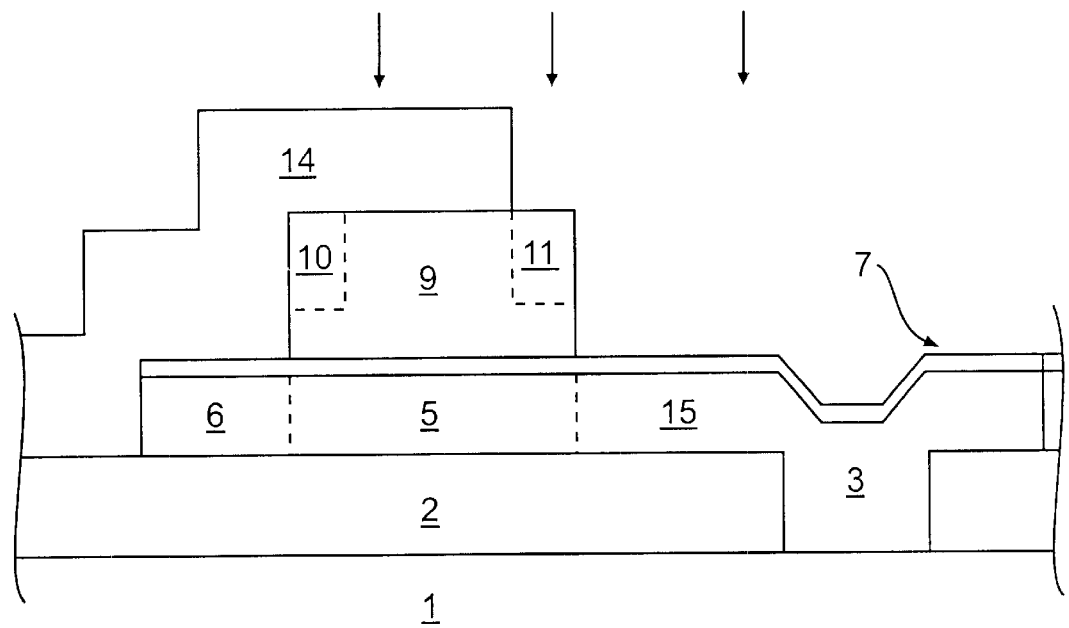

With reference to FIG. 6, formation of the P-region 15 of the PIN and the P-implant 11 is described. A temporary mask, e.g. photoresist 14 is applied and a heavy p-type dopant, e.g. boron, is implanted to one side of the diode body. The side implanted with p-type dopants is immaterial except that it must be the opposite side from that in which the n-type dopant was implanted. The particular side chosen is a matter of design choice. The final dopant concentration in film 4 should be in excess of $1\times10^{18}$ atoms/centimeter$^3$. For processing efficiency, the implant step may be shared with, for example, a CMOS PFET source/drain implant step, so that it comes "for free" in a BiCMOS process. The top polysilicon 9, which comes "for free" in a bipolar or BiCMOS process, serves to mask implant 11 from getting into lower silicon film 4, the body region of the PIN diode, thus self-aligning the implant to one edge of the PIN diode body. Notice that polysilicon 9 has shielded a region 5 which is thus the intrinsic region of the PIN diode.

Figure 7:
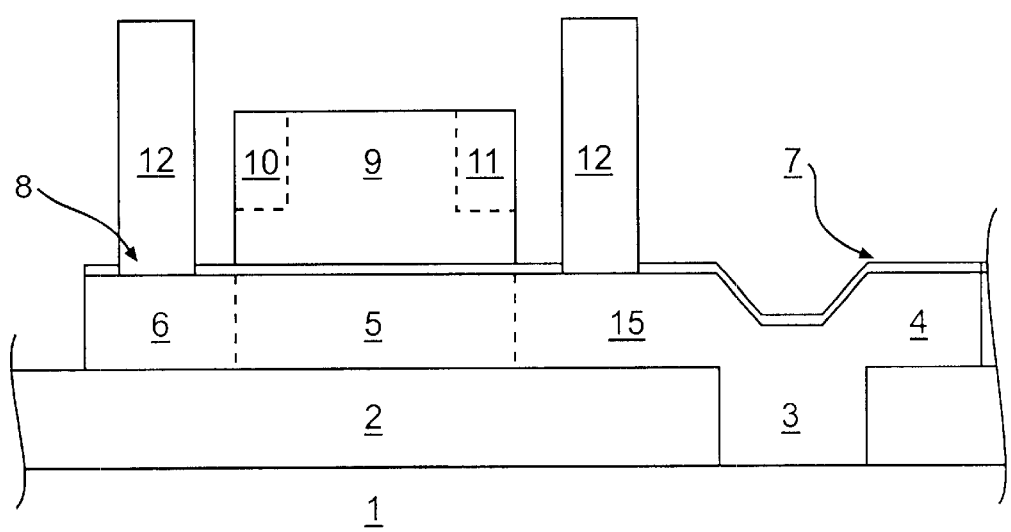
FIG. 7 illustrates the laterally extended intrinsic PIN diode finished with wiring.

Now, with reference to FIG. 7, the completed PIN diode is described.

After subsequent processing steps to create other devices on the wafer, electrical contacts may be put into place to connect lateral PIN diode electrically with other devices. The oxide film on top of the lower silicon/large-grain polysilicon layer may be removed immediately beneath contacts for good electrical connection using a short wet etchant dip (such as in hydrofluoric acid, HF) prior to deposition of the metal. Optionally, silicon/large-grain polysilicon beneath contacts may be silicided (deposited with titanium or cobalt, followed by an anneal to react chemically with the silicon) for better contact. Ti or Co silicide formation is a standard process step in any modern silicon processing facility and is thus not described herein.

It will, therefore, be appreciated by those skilled in the art having the benefit of this disclosure that this invention is capable of producing an extended lateral PIN diode Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments. Specifically, the invention is disclosed and claimed in terms specific to silicon processes. However, it is to be understood that the invention may be embodied in semiconductor materials other than silicon.

What is claimed is:

1. A lateral PIN diode comprising:
   a semiconductor substrate;
   field isolation means formed on a major surface of said semiconductor substrate;
   a PIN diode body formed above and on a major surface of said field isolation means, wherein said PIN diode body comprises N-type, intrinsic, and P-type regions, and wherein said intrinsic region lies between and abuts said N-type and said P-type regions;
   an oxide film (7) formed on a major surface of said PIN diode body; and
   a masking module formed on a major surface of said oxide film wherein said masking module is aligned above said intrinsic region and wherein said masking module has N-type and P-type edge implants therein defined wherein each said implant is proximate to the respective type region of said second semiconductor layer.

2. A lateral PIN diode according to claim 1, wherein said masking module is an emitter module.

3. A lateral PIN diode according to claim 1, wherein said semiconductor substrate comprises monocrystalline material.

4. A lateral PIN diode according to claim 1, wherein said monocrystalline material is selected from the group consisting of silicon and gallium arsenide.

5. A lateral PIN diode according to claim 1, wherein said semiconductor substrate is from a silicon bipolar or BiCMOS process.

6. A lateral PIN diode according to claim 1, wherein said field isolation means comprises dielectric material compatible with silicon processing.

7. A lateral PIN diode according to claim 1, wherein said field isolation means consists of material selected from the group consisting of silicon dioxide and silicon nitride.

8. A lateral PIN diode according to claim 1, wherein said field isolation means comprises isolation oxide.

9. A lateral PIN diode according to claim 1, wherein said isolation oxide is selected from the group consisting of shallow trench isolation and LOCOS.

10. A lateral PIN diode according to claim 1, wherein said field isolation means optionally has formed therethrough at least one opening communicating with said semiconductor substrate.

11. A lateral PIN diode according to claim 1, wherein said PIN diode body comprises large grain polysilicon.

12. A lateral PIN diode according to claim 1, wherein said PIN diode body comprises single crystal silicon.

13. A lateral PIN diode according to claim 1, wherein said N-type, intrinsic, and P-type regions are co-planar.

14. A lateral PIN diode according to claim 1, wherein the width of said intrinsic region is from about 1 micron to about 10 microns.

15. A lateral PIN diode according to claim 1, wherein the length of said intrinsic region is from about 1 micron to about 10 microns.

16. A lateral PIN diode according to claim 1, wherein said oxide film comprises $SiO_2$.

17. A lateral PIN diode according to claim 1, wherein the thickness of said oxide film is from about 300 Å to about 1000 Å.

18. A lateral PIN diode according to claim 1, wherein said masking module has substantially the same cross section as said intrinsic region.

* * * * *